(12) United States Patent
Yoshiwara et al.

(10) Patent No.: US 7,964,685 B2
(45) Date of Patent: Jun. 21, 2011

(54) POLYMERIZABLE COMPOSITION

(75) Inventors: Akihiko Yoshiwara, Tokyo (JP); Junji Kodemura, Tokyo (JP)

(73) Assignee: Zeon Corporation, Tokyo (JP)

( * ) Notice: Subject to any disclaimer, the term of this patent is extended or adjusted under 35 U.S.C. 154(b) by 86 days.

(21) Appl. No.: 12/521,502

(22) PCT Filed: Dec. 27, 2007

(86) PCT No.: PCT/JP2007/075158
§ 371 (c)(1),
(2), (4) Date: Jul. 15, 2009

(87) PCT Pub. No.: WO2008/081885
PCT Pub. Date: Jul. 10, 2008

(65) Prior Publication Data
US 2010/0144924 A1    Jun. 10, 2010

(30) Foreign Application Priority Data
Dec. 28, 2006  (JP) ................................ 2006-355920

(51) Int. Cl.
C08G 61/08 (2006.01)
C08F 2/02 (2006.01)
C08F 4/70 (2006.01)
C08F 36/00 (2006.01)
B32B 15/08 (2006.01)

(52) U.S. Cl. ........ 526/280; 526/172; 526/281; 526/282; 526/283

(58) Field of Classification Search .................. 526/172, 526/280, 281, 283
See application file for complete search history.

(56) References Cited

U.S. PATENT DOCUMENTS

| 5,096,644 A | 3/1992 | Endo et al. |
| 5,302,656 A | 4/1994 | Kohara et al. |
| 7,476,716 B2 * | 1/2009 | Sugawara ..................... 526/281 |
| 2006/0211834 A1 | 9/2006 | Sugawara |

FOREIGN PATENT DOCUMENTS

| EP | 0 349 855 | 1/1990 |
| EP | 0 936 231 | 8/1999 |
| JP | 4-218557 A | 8/1992 |
| JP | 6-65407 A | 3/1994 |
| JP | 10-316828 A | 12/1998 |
| JP | 2002-344100 A | 11/2002 |
| JP | 2004-63326 A | 2/2004 |
| WO | WO-2004/003052 A1 | 1/2004 |

* cited by examiner

Primary Examiner — Caixia Lu
(74) Attorney, Agent, or Firm — Birch, Stewart, Kolasch & Birch, LLP

(57) ABSTRACT

A polymerizable composition is obtained by mixing a metathesis polymerization catalyst including benzylidene(1,3-dimethyl-4-imidazolidin-2-ylidene)(tricyclohexylphosphine)ruthenium dichloride, a cycloolefin monomer such as 2-norbornene or tetracyclo[6.2.1.1$^{3,6}$.0$^{2,7}$]dodec-4-ene, a chain transfer agent such as allyl methacrylate, and hollow particles such as Shirasu balloons. A crosslinkable resin composite is obtained by coating or impregnating the polymerizable composition onto or into a support medium, and carrying out bulk polymerization of the polymerizable composition. A crosslinked resin composite is obtained by crosslinking the crosslinkable resin composite.

14 Claims, No Drawings

POLYMERIZABLE COMPOSITION

TECHNICAL FIELD

The present invention relates to a polymerizable composition, a crosslinkable resin, and production methods thereof. More particularly, the present invention relates to a polymerizable composition which can give a crosslinkable resin suitable as an electric material and the like used in an electric circuit substrate, a crosslinkable resin obtained using such polymerizable composition, a method for producing the crosslinkable resin and the like, and applications of a crosslinked body, a composite, a laminate and the like being excellent in electric insulation, heat resistance and dielectric properties.

BACKGROUND ART

A crosslinked resin can be obtained by crosslinking a thermoplastic resin with a crosslinking agent such as an organic peroxide. The demand for crosslinked resins as a circuit substrate insulation material used in electrical devices, especially communications, computers and the like, is increasing. A circuit substrate insulation material needs to have a low relative permittivity and heat resistance to withstand use for high density wiring. Various proposals have been made to respond to these needs.

For example, Patent Literature 1 discloses a polymerizable composition comprising a norbornene monomer, a metathesis polymerization catalyst, a chain transfer agent and a crosslinking agent. According to Patent Literature 1, this polymerizable composition has fluidity, and can thus be soaked into a support medium made of nonwoven fabric or the like or be molded into a film form. A crosslinkable thermoplastic resin can be obtained by carrying out bulk polymerization of this polymerizable composition. Further, Patent Literature 1 also discloses that various crosslinked resin composites can be obtained by laminating this crosslinkable thermoplastic resin on a substrate such as a metal foil, and crosslinking the laminate.

Patent Literature 1 International Publication No. WO2004/003052

Patent Literature 2 discloses an electrical insulation material in which air bubbles or air chambers are enclosed in a dicyclopentadiene resin. Patent Literature 2 discloses that this electrical insulation material is obtained by blending a metathene monomer, a ruthenium complex catalyst, and plastic balloons, and curing the resultant mixture.

Patent Literature 2 Japanese Patent Laid-Open No. 2004-63326

Patent Literature 3 discloses a resin composition in which fine hollow glass spheres having a ratio of shell wall thickness to particle size of 1/6 to 1/11 are mixed in a thermosetting resin. Patent Literature 3 teaches that a prepreg can be obtained by impregnating this resin composition in a substrate, and drying the impregnated substrate. As the thermosetting resin, Patent Literature 3 discloses a thermosetting polyimide resin which contains a diamine and bismaleimide as main components.

Patent Literature 3 Japanese Patent Laid-Open No. H06-65407

DISCLOSURE OF INVENTION

Problems to be Resolved by the Invention

According to researches made by the present inventors, the crosslinked bodies obtained from the resins and the like disclosed in the above-mentioned patent literatures still fail to have a sufficiently low relative permittivity which affects high-frequency electric conductivity. Further, it was also difficult to obtain both a low dielectric constant and a low linear expansion coefficient. In addition, such crosslinked bodies had poor solder dip resistance which is resistance to blisters forming due to soldering.

Further, in the electrical insulation materials obtained by the methods disclosed in Patent Literatures 2 and 3, hollow particles float in the resin during molding due to a difference in the specific gravity of the hollow particles and the resin. As a result, the hollow particles are unevenly distributed in the electrical insulation material, which can produce an uneven distribution in the dielectric constant.

Objects of the present invention are to provide a polymerizable composition which can give a crosslinkable resin suitable as an electric material and the like used in an electric circuit substrate, a crosslinkable resin obtained using such polymerizable composition, a method for producing the crosslinkable resin and the like, and applications of a crosslinked body, a composite, a laminate and the like being excellent in balance between low dielectric constant and low linear expansion coefficient and having an excellent solder dip resistance.

Means for Solving the Problems

The inventors earnestly proceeded with studies in order to achieve the above objects and found that a crosslinkable resin can be obtained by making a chain transfer agent, a crosslinking agent, and hollow particles included in polymerizable composition comprising a cycloolefin monomer and a metathesis polymerization catalyst, and then carrying out bulk polymerization of the resultant mixture. Further, the inventors found that a crosslinked body being excellent in a balance between a low dielectric constant and a low linear expansion coefficient and having an excellent solder dip resistance can be obtained by using this crosslinkable resin. Based on these findings, further studies were made, whereby the present invention was completed.

Specifically, the present invention includes the following embodiments.

(1) A polymerizable composition comprising a cycloolefin monomer, a metathesis polymerization catalyst, a chain transfer agent, a crosslinking agent, and hollow particles.

(2) The aforementioned polymerizable composition, wherein primary particles of the hollow particles have a median size of 50 μm or less.

(3) The aforementioned polymerizable composition, wherein the hollow particles have a void ratio of 10% by volume or more.

(4) The aforementioned polymerizable composition, wherein the content of the hollow particles is 0.1 to 80% by volume.

(5) The aforementioned polymerizable composition, wherein the hollow particles are inorganic hollow particles.

(6) The aforementioned polymerizable composition, wherein the hollow particles are surface treated with a coupling agent.

(7) The aforementioned polymerizable composition, wherein the metathesis polymerization catalyst is a ruthenium-carbene complex.

(8) A crosslinkable resin obtainable by bulk polymerization of the aforementioned polymerizable composition.

(9) A method of producing a crosslinkable resin, comprising a step of carrying out bulk polymerization of the aforementioned polymerizable composition.

(10) A method of producing a crosslinkable resin composite, comprising steps of coating or impregnating the aforementioned polymerizable composition onto or into a support medium, and then carrying out bulk polymerization of the polymerizable composition.
(11) A method of producing a crosslinked body, comprising a step of crosslinking the aforementioned crosslinkable resin.
(12) A method of producing a crosslinked resin composite, comprising a step of crosslinking a molded body made of the above crosslinkable resin on a support medium.
(13) A method of producing a crosslinked resin composite, comprising a step of crosslinking a crosslinkable resin composite obtainable by the aforementioned method of producing a crosslinkable resin composite.
(14) The aforementioned method of producing a crosslinked resin composite, wherein the crosslinking is carried out on a separate support medium.

Advantageous Effects of Invention

If the polymerizable composition of the present invention is subjected to bulk polymerization and the resultant material is crosslinked, then a crosslinked body can be obtained which has excellent characteristics in electric insulation, heat resistance, dielectric properties and the like, and which achieves a good balance between a low dielectric constant and a low linear expansion coefficient.

Laminating this crosslinked body on a film-shaped substrate or combining this crosslinked body with a textile material can give a composite having the above-described characteristics.

The crosslinked body and composite obtained using the polymerizable composition of the present invention are suitable as an electric material used in an electric circuit substrate and the like.

BEST MODE FOR CARRYING OUT THE INVENTION

[Polymerizable Composition]
The polymerizable composition of the present invention comprises a cycloolefin monomer, a metathesis polymerization catalyst, a chain transfer agent, a crosslinking agent, and hollow particles.
(1) Cycloolefin Monomer
The cycloolefin monomer constituting the polymerizable composition is a compound having a ring structure formed by carbon atoms and having a carbon-carbon double bond in the ring. Examples of the cycloolefin monomer include norbornene monomers. Norbornene monomers are monomers having a norbornene ring. Specific examples include norbornenes, dicyclopentadienes, and tetracyclododecenes. These may have as a substituent a hydrocarbon group such as an alkyl group, an alkenyl group, an alkylidene group, or an aryl group, or a polar group such as a carboxyl group or an acid anhydride group.

Further, in addition to the double bond in the norbornene ring, the norbornene monomer may have a further double bond. Among these, norbornene monomers which do not have a polar group, that is, are constituted only by carbon atoms and hydrogen atoms are preferred.

Examples of norbornene monomers which do not have a polar group include dicyclopentadienes such as dicyclopentadiene, methyldicyclopentadiene, and dihydrodicyclopentadiene (also known as tricyclo[5.2.1.0$^{2,6}$]dec-8-ene);

tetracyclododecenes such as tetracyclo[6.2.1.1$^{3,6}$.0$^{2,7}$]dodec-4-ene, 9-methyltetracyclo[6.2.1.1$^{3,6}$.0$^{2,7}$]dodec-4-ene, 9-ethyltetracyclo[6.2.1.1$^{3,6}$.0$^{2,7}$]dodec-4-ene, 9-cyclohexyltetracyclo[6.2.1.1$^{3,6}$.0$^{2,7}$]dodec-4-ene, 9-cyclopentyltetracyclo[6.2.1.1$^{3,6}$.0$^{2,7}$]dodec-4-ene, 9-methylenetetracyclo[6.2.1.1$^{3,6}$.0$^{2,7}$]dodec-4-ene, 9-ethylidenetetracyclo[6.2.1.1$^{3,6}$.0$^{2,7}$]dodec-4-ene, 9-vinyltetracyclo[6.2.1.1$^{3,6}$.0$^{2,7}$]dodec-4-ene, 9-propenyltetracyclo[6.2.1.1$^{3,6}$.0$^{2,7}$]dodec-4-ene, 9-cyclohexenyltetracyclo[6.2.1.1$^{3,6}$.0$^{2,7}$]dodec-4-ene, 9-cyclopentenyltetracyclo[6.2.1.1$^{3,6}$.0$^{2,7}$]dodec-4-ene, and 9-phenyltetracyclo[6.2.1.1$^{3,6}$.0$^{2,7}$]dodec-4-ene;

norbornenes such as 2-norbornene, 5-methyl-2-norbornene, 5-ethyl-2-norbornene, 5-butyl-2-norbornene, 5-hexyl-2-norbornene, 5-decyl-2-norbornene, 5-cyclohexyl-2-norbornene, 5-cyclopentyl-2-norbornene, 5-ethylidene-2-norbornene, 5-vinyl-2-norbornene, 5-propenyl-2-norbornene, 5-cyclohexenyl-2-norbornene, 5-cyclopentenyl-2-norbornene, 5-phenyl-2-norbornene, tetracyclo[9.2.1.0$^{2,10}$.0$^{3,8}$]tetradeca-3,5,7,12-tetraene (also known as 1,4-methano-1,4,4a,9a-tetrahydro-9H-fluorene), tetracyclo[10.2.1.0$^{2,10}$.0$^{4,9}$]pentadeca-4,6,8,13-tetraene (also known as 1,4-methano-1,4,4a,9,9a,10-hexahydroanthracene);

cycloolefins with a five or more members ring such as pentacyclo[6.5.1.1$^{3,6}$.0$^{2,7}$.0$^{9,13}$]pentadeca-4,10-diene, pentacyclo[9.2.1.1$^{4,7}$.0$^{2,10}$.0$^{3,8}$]pentadeca-5,12-diene, hexacyclo[6.6.1.1$^{3,6}$.1$^{10,13}$.0$^{2,7}$.0$^{9,14}$]heptadeca-4-ene and the like.

Examples of norbornene monomers which have a polar group include methyl tetracyclo[6.2.1.1$^{3,6}$.0$^{2,7}$]dodec-9-ene-4-carboxylate, tetracyclo[6.2.1.1$^{3,6}$.0$^{2,7}$]dodec-9-ene-4-methanol, tetracyclo[6.2.1.1$^{3,6}$.0$^{2,7}$]dodec-9-ene-4-carboxylic acid, tetracyclo[6.2.1.1$^{3,6}$.0$^{2,7}$]dodec-9-ene-4,5-dicarboxylic acid, tetracyclo[6.2.1.1$^{3,6}$.0$^{2,7}$]dodec-9-ene-4,5-dicarboxylic anhydride, methyl 5-norbornene-2-carboxylate, methyl 2-methyl-5-norbornene-2-carboxylate, 5-norbornen-2-yl acetate, 5-norbornen-2-methanol, 5-norbornene-2-ol, 5-norbornene-2-carbonitrile, 2-acetyl-5-norbornene, 7-oxa-2-norbornene and the like.

In addition, in the present invention, a monocyclic cycloolefin such as cyclobutene, cyclopentene, cyclooctene, cyclododecene and 1,5-cyclooctadiene, or a derivative thereof such as a monocyclic cycloolefin having a substituent may be added into the above-described norbornene monomer to carry out the polymerization. These cycloolefin monomers may be used alone or in combination of two or more. A molded body of the obtained crosslinkable resin arbitrarily can have a glass transition temperature and melting point controlled by using two or more monomers and changing their relative proportions. The added amount of the monocyclic cycloolefin and derivative thereof is preferably 40% by mass or less, more preferably 20% by mass or less, with respect to the total amount of the cycloolefin monomer. If the added amount is more than 40% by mass, the heat resistance of the polymer obtained by bulk polymerization may be insufficient.

(2) Metathesis Polymerization Catalyst
There are no specific limitations on the metathesis polymerization catalyst constituting the polymerizable composition, as long as the catalyst can subject the cycloolefin monomer to metathesis ring-opening polymerization.

As the metathesis polymerization catalyst, a complex formed from a plurality of ions, atoms, polyatomic ions and/or compounds coordinated to a transition metal atom as the center atom is mentioned. As the transition metal atoms, atoms belonging in the groups V, VI, and VIII in a long periodic-type periodic table (hereinafter the same) may be preferably used. Although there are no specific limitations on the respective atoms belonging to each group, preferred examples include tantalum as the group V atom, molybdenum and tungsten as the group VI atom, and ruthenium and osmium as the group VIII atom.

Of these, it is preferred to use a complex of the group VIII ruthenium or osmium for the metathesis polymerization catalyst, and a ruthenium-carbene complex is particularly preferred. Further, a ruthenium-carbene complex has excellent catalyst activity in bulk polymerization, and thus exhibits excellent productivity for a crosslinkable resin, and can give the crosslinkable resin with almost no unfavorable odor originating from residual unreacted monomers. Further, since a group VIII ruthenium or osmium complex is comparatively stable against and is not easily deactivated by oxygen or moisture in the air, the crosslinkable resin can be produced even in the air.

The ruthenium-carbene complex is a compound represented by the following formula (1) or (2).

[Formula 1]

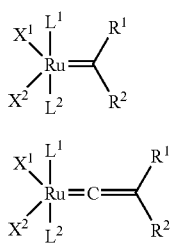

(1)

(2)

In the formulas (1) and (2), $R^1$ and $R^2$ each independently represent hydrogen atom, halogen atom, or hydrocarbon group having 1 to 20 of carbon atoms which may contain halogen atom, oxygen atom, nitrogen atom, sulfur atom, phosphorus atom, or silicon atom. $X^1$ and $X^2$ each independently represent an arbitrary anionic ligand. $L^1$ and $L^2$ each independently represent a hetero atom-containing carbene compound or a neutral electron-donating compound. $R^1$ and $R^2$ may be bonded with each other to form a ring. The $R^1$, $R^2$, $X^1$, $X^2$, $L^1$, and $L^2$ may also bond with each other in an arbitrary combination to form a multidentate chelated ligand.

The hetero atom is an atom belonging in the Group XV or XVI in the Periodic Table. Specific examples include N, O, P, S, As, and Se. Of these, N, O, P, and S are preferable, and N, that is nitrogen atom, is particularly preferable, because a stable carbene compound can be obtained.

In a hetero atom-containing carbene compound, the hetero atoms bonding to both sides of the carbene carbon atom is preferable, and more preferably a carbene carbon atom and hetero atoms on both sides of the carbene carbon atom constitute a hetero ring. It is preferred that the hetero atoms adjacent to the carbene carbon atom have a bulky substituent.

As the hetero atom-containing carbene compound, compounds represented by the following formula (3) or (4) are mentioned.

[Formula 2]

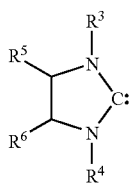

(3)

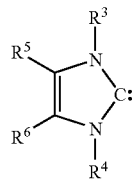

(4)

In the formulas, $R^3$ to $R^6$ each independently represent hydrogen atom, halogen atom, or hydrocarbon group having 1 to 20 of carbon atoms which may contain halogen atom, oxygen atom, nitrogen atom, sulfur atom, phosphorus atom, or silicon atom. $R^3$ to $R^6$ may also be bonded with each other in an arbitrary combination to form a ring.

The compounds represented by the formula (3) or (4) include 1,3-dimesitylimidazolidin-2-ylidene, 1,3-di(1-adamantyl)imidazolidin-2-ylidene, 1-cyclohexyl-3-mesitylimidazolidin-2-ylidene, 1,3-dimesityloctahydrobenzimidazol-2-ylidene, 1,3-diisopropyl-4-imidazolin-2-ylidene, 1,3-di(1-phenylethyl)-4-imidazolin-2-ylidene, 1,3-dimesityl-2,3-dihydrobenzimidazol-2-ylidene and the like.

In addition to the compounds represented by the above formula (3) or (4), other hetero atom-containing carbene compounds such as 1,3,4-triphenyl-2,3,4,5-tetrahydro-1H-1,2,4-triazol-5-ylidene, 1,3-dicyclohexylhexahydropyrimidin-2-ylidene, N,N,N',N'-tetraisopropylformamidinylidene, 1,3,4-triphenyl-4,5-dihydro-1H-1,2,4-triazol-5-ylidene, 3-(2,6-diisopropylphenyl)-2,3-dihydrothiazol-2-ylidene and the like can be used.

In the above formulas (1) and (2), the anionic ligands $X^1$ and $X^2$ are ligands having a negative charge when separated from the central metal atom. Examples of these ligands include halogen atom such as F, Cl, Br, and I; diketonate group, substituted cyclopentadienyl group, alkoxy group, aryloxy group, carboxyl group and the like. Of these, halogen atom is preferable, and chlorine atom is more preferable.

The neutral electron-donating compound may be any ligand having a neutral charge when separated from the central metal. Specific examples thereof include carbonyls, amines, pyridines, ethers, nitriles, esters, phosphines, thioethers, aromatic compounds, olefins, isocyanides, thiocyanates and the like. Of these, phosphines, ethers, and pyridines are preferable, and trialkylphosphines are more preferable.

The complex compounds represented by the above formula (1) include ruthenium complex compounds in which one of an $L^1$ and $L^2$ is a hetero atom-containing carbene compound and the other is a neutral electron-donating compound, such as benzylidene(1,3-dimesitylimidazolidin-2-ylidene)(tricyclohexylphosphine)ruthenium dichloride, benzylidene (1,3-dimesityl-4,5-dibromo-4-imidazolin-2-ylidene)(tricyclohexylphosphine)ruthenium dichloride, (1,3-dimesityl-4-imidazolin-2-ylidene)(3-phenyl-1H-inden-1-ylidene) (tricyclohexylphosphine)ruthenium dichloride, (1,3-dimesitylimidazolidin-2-ylidene)(3-methyl-2-butene-1-ylidene)(tricyclopentylphosphine)ruthenium dichloride, benzylidene(1,3-dimesityl-octahydrobenzimidazol-2-ylidene)(tricyclohexylphosphine)ruthenium dichloride, benzylidene[1,3-di(1-phenylethyl)-4-imidazolin-2-ylidene](tricyclohexylphosphine)ruthenium dichloride, benzylidene(1,3-dimesityl-2,3-dihydrobenzimidazol-2-ylidene) (tricyclohexylphosphine)ruthenium dichloride, benzylidene (tricyclohexylphosphine)(1,3,4-triphenyl-2,3,4,5-tetrahydro-1H-1,2,4-triazol-5-yliden)ruthenium dichloride, (1,3-diisopropylhexahydropyrimidin-2-ylidene)(ethoxymethylene)(tricyclohexylphosphine)ruthenium dichloride, benzylidene(1,3-dimesitylimidazolidin-2-ylidene)pyridine ruthenium dichloride, (1,3-dimesitylimidazolidin-2-ylidene)(2-phenylethylidene)(tricyclohexylphosphine)ruthenium dichloride, (1,3-dimesityl-4-imidazolin-2-ylidene)(2-phenylethylidene)(tricyclohexylphosphine)ruthenium dichloride, (1,3-dimesityl-4,5-dibromo-4-imidazolin-2-ylidene)[(phenylthio)methylene](tricyclohexylphosphine) ruthenium dichloride, (1,3-dimesityl-4,5-dibromo-4-imidazolin-2-ylidene)(2-pyrolidon-1-ylmethylene)(tricyclohexylphosphine)ruthenium dichloride;

ruthenium complex compounds in which both $L^1$ and $L^2$ are neutral electron-donating compounds, such as benzylidenebis(tricyclohexylphosphine)ruthenium dichloride, and (3-methyl-2-buten-1-ylidene)bis(tricyclopentylphosphine)ruthenium dichloride;

ruthenium complex compounds in which both $L^1$ and $L^2$ are hetero atom-containing carbene compounds, such as benzylidenebis(1,3-dicyclohexyliraidazolidin-2-ylidene)ruthenium dichloride, and benzylidenebis(1,3-diisopropyl-4-imidazolin-2-ylidene)ruthenium dichloride; and the like.

The complex compounds represented by the above formula (2) include (1,3-dimesitylimidazolidin-2-ylidene)(phenylvinylidene)(tricyclohexylphosphine)ruthenium dichloride, (t-butylvinylidene)(1,3-diisopropyl-4-imidazolin-2-ylidene)(tricyclopentylphosphine)ruthenium dichloride, bis(1,3-dicyclohexyl-4-imidazolin-2-ylidene)phenylvinylidene ruthenium dichloride and the like.

Of these complex compounds, ruthenium complex compounds which are represented by the above formula (1), and which have one compound represented by the above formula (4) as a ligand are preferred, and ruthenium complex compounds which are represented by the above formula (1), in which one of $L^1$ and $L^2$ is a compound represented by the above formula (4) and the other is a neutral electron-donating compound, are most preferred.

These metathesis polymerization catalysts can be produced by the methods described in Org. Lett., 1999, Vol. 1, p. 953 or Tetrahedron. Lett., 1999, Vol. 40, p. 2247, for example.

The amount of metathesis polymerization catalyst used is in the range of usually 1:2,000 to 1:2,000,000, preferably 1:5,000 to 1:1,000,000, and more preferably 1:10,000 to 1:500,000 in a molar ratio of metal atoms in the catalyst:the cycloolefin monomer.

The metathesis polymerization catalyst may be used by being dissolved or suspended in a small amount of an inert solvent as necessary. Examples of the solvent include linear aliphatic hydrocarbons such as n-pentane, n-hexane, n-heptane, liquid paraffin, and mineral spirit; alicyclic hydrocarbons such as cyclopentane, cyclohexane, methylcyclohexane, dimethylcyclohexane, trimethylcyclohexane, ethylcyclohexane, diethylcyclohexane, decahydronaphthalene, dicycloheptane, tricyclodecane, hexahydroindene, and cyclooctane; aromatic hydrocarbons such as benzene, toluene, and xylene; hydrocarbons having a fused ring of an aromatic ring and an alicyclic ring such as indene, indane, and tetrahydronaphthalene; nitrogen atom-containing hydrocarbons such as nitromethane, nitrobenzene, and acetonitrile; and oxygen atom-containing hydrocarbons such as diethyl ether and tetrahydrofuran. Of these, it is preferred to use industrial general purpose aromatic hydrocarbons, aliphatic hydrocarbons, and alicyclic hydrocarbons. In addition, liquid antioxidant, liquid plasticizer, or liquid elastomer may also be used as the solvent as long as the activity of the metathesis polymerization catalyst is not reduced.

An activator, that is co-catalyst, may also be used in combination with the metathesis polymerization catalyst. The activator is used to control the polymerization activity or to enhance the rate of the polymerization reaction. The activator includes an alkylated compound, a halogenated compound, an alkoxylated compound, an aryloxylated compound and the like, of aluminum, scandium, or tin.

Specific examples of the activator include trialkoxy aluminum, triphenoxy aluminum, dialkoxyalkyl aluminum, alkoxydialkyl aluminum, trialkyl aluminum, dialkoxy aluminum chloride, alkoxyalkyl aluminum chloride, dialkyl aluminum chloride, trialkoxy scandium, tetraalkoxy titanium, tetraalkoxy tin, tetraalkoxy zirconium and the like.

The amount of the activator used is in the range of usually 1:0.05 to 1:100, preferably 1:0.2 to 1:20, and more preferably 1:0.5 to 1:10 in a molar ratio of metal atoms in the metathesis polymerization catalyst:activator.

When the complex of a transition metal atom belonging in the Group V and the Group VI is used as a metathesis polymerization catalyst, it is preferred that both the metathesis polymerization catalyst and the activator are dissolved in the monomer. However, it is possible to dissolve or suspend the metathesis polymerization catalyst and the activator in a small amount of solvent as long as the properties of the resulting product are not essentially impaired.

(3) Chain Transfer Agent

The polymerizable composition of the present invention further comprises a chain transfer agent for the polymerization reaction.

As the chain transfer agents, a linear olefins which may have a substituent may be employed.

Specific examples thereof include aliphatic olefins such as 1-hexene and 2-hexene; olefins having an aromatic group such as styrene, divinylbenzene, and stilbene; olefins having an alicyclic hydrocarbon group such as vinyl cyclohexane; vinyl ethers such as ethyl vinyl ether; vinyl ketones such as methyl vinyl ketone, 1,5-hexadien-3-one, 2-methyl-1,5-hexadien-3-one; styryl acrylate, ethylene glycol diacrylate; allyl trivinyl silane, allyl methyl divinyl silane, allyl dimethyl vinyl silane; glycidyl acrylate, allyl glycidyl ether; allylamine, 2-(diethylamino)ethanol vinyl ether, 2-(diethylamino)ethyl acrylate, 4-vinylaniline and the like.

Of these chain transfer agents, agents having a group which contributes to crosslinking as the above-described substituent are preferable. Specific examples of the groups which contribute to crosslinking include groups having a carbon-carbon double bond, such as vinyl group, acryloyl group, methacryloyl group and the like. Especially preferred are compounds represented by the formula (A)

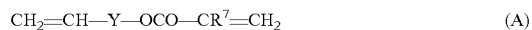

$$CH_2=CH-Y-OCO-CR^7=CH_2 \qquad (A)$$

In the formula (A), Y represents alkylene group and $R^7$ represents hydrogen atom or methyl group.

Although the number of carbon atom in the alkylene group is not especially limited, it is usually from 1 to 20, and preferably from 4 to 12. Using a chain transfer agent with this structure can give a crosslinked resin molded body or crosslinked resin composite having high mechanical strength.

The compounds represented by the formula (A) include allyl methacrylate, 3-buten-1-yl methacrylate, allyl acrylate, 3-buten-1-yl acrylate, undecenyl methacrylate, hexenyl methacrylate and the like. Of these, undecenyl methacrylate and hexenyl methacrylate are especially preferred.

The added amount of the chain transfer agent is usually 0.01 to 10% by mass, and preferably 0.1 to 5% by mass, based on the total amount of the cycloolefin monomer. If the added amount of the chain transfer agent is within this range, the polymerization reaction rate is high, and a crosslinkable thermoplastic resin can be efficiently obtained.

(4) Hollow Particles

The hollow particles used in the present invention have a void in their interior. The void of these hollow particles does not contact the outside of the particles. Examples of the external shape of the hollow particles include, but are not especially limited to, spherical, plate-like, irregular, rod-like, fibrous and the like. Preferably, the hollow particles have a spherical or irregular shape.

The hollow particles is usually 50 μm or less, preferably 0.01 to 50 μm, more preferably 0.05 to 25 μm, even more preferably 0.05 to 10 μm, and especially preferably 0.1 to 5 μm in a median size based on number frequency distribution of the primary particles size, in terms of their long axis size. The median size of the hollow particles can be measured by, for example, a laser scattering diffraction type particle size distribution meter.

If the hollow particles have too small particle size, production thereof is difficult and sometimes a sufficient void ratio cannot be obtained. Further, the viscosity of the polymerizable composition or the below-described monomer solution may increase, whereby moldability can deteriorate. If the hollow particles have too large particle size, an uneven distribution can occur in the dielectric constant of the obtained crosslinked body and the like. Moreover, it is difficult to produce a thin crosslinked body and the like, and the drilling workability and plating properties of the crosslinked body and the like can also deteriorate.

The hollow particles have a void ratio of usually 10% by volume or more, preferably 20 to 90% by volume, more preferably 25 to 80% by volume, and especially preferably 30 to 70% by volume. If the void ratio is too high, the shell thickness becomes too thin, whereby the hollow particles can collapse during production of the polymerizable composition, polymerization or crosslinking. On the other hand, if the void ratio is too low, the effects of reducing the relative permittivity of the obtained crosslinked body and the like may not be sufficiently expressed.

Here, the void ratio is a value as measured by Archimedes' method, and is determined according to the following formula from the specific gravity of the hollow particles themselves and the specific gravity of the material constituting those hollow particles.

Void Ratio=((Specific Gravity of the Material Constituting the Hollow Particles)−(Specific Gravity of the Hollow Particles Themselves))/(Specific Gravity of the Material Constituting the Hollow Particles)

For example, using spherical silica hollow particles as the hollow particles, if the specific gravity measurement value of those hollow particles is 1.1 g/cm$^3$, by dividing this value by the theoretical specific gravity of amorphous silica of 2.2 g/cm$^3$, the average void ratio thereof is calculated as 50% by volume. The specific gravity can be measured using a Pycnometer automatic particulate true density measuring device (Product name: "Auto True Denser MAT-7000", manufactured by Seishin Enterprise Co., Ltd.).

If the void ratio is too small, the effects of reducing the relative permittivity tend to decrease. If the void ratio is too large, the strength of the hollow particles is insufficient, so that hollow particles tend to collapse.

The hollow particles preferably have a BET specific surface area of 0.1 to 1000 m$^2$/g, more preferably 0.1 to 500 m$^2$/g, still more preferably 1 to 100 m$^2$/g, and most preferably 1 to 50 m$^2$/g.

Although the hollow particles may be dispersed as hollow particle agglomerates in the polymerizable composition, it is more preferred for the hollow particles to be dispersed as primary particles.

The hollow particles include inorganic hollow particles and organic hollow particles.

Inorganic hollow particles formed from known materials may be used. Examples of the material include an oxide, nitride, boride, and hydroxide of an inorganic element, as well as a hydrate thereof. Of these, preferred are oxide, nitride, and boride, and especially oxide, because the production of the hollow particles is easy and the linear expansion coefficient is small The inorganic element constituting the inorganic hollow particles includes at least one element selected from the group consisting of Si, Al, B, Zr, Ti, Fe, Ca, Sn, Ce, P, Mo, Zn, W, Ni, Cu, Nb, and Mg.

Specific examples include silica ($SiO_2$), alumina ($Al_2O_3$), zirconium oxide ($ZrO_2$), zeolite, titanium oxide ($TiO_2$), aluminum nitride (AlN), silicon carbide (SiC), silicon nitride ($Si_3N_4$), barium titanate ($BaTiO_3$), strontium titanate ($SrTiO_3$), calcium titanate ($CaTiO_3$), Shirasu, aluminum borate, boronite, calcium carbonate, lead oxide, tin oxide, cerium oxide, calcium oxide, trimanganese tetroxide, magnesium oxide, cerium zirconate, calcium silicate, zirconium silicate, indium tin oxide (ITO), titanium silicate, glass and the like.

The production method of such inorganic hollow particles is not especially limited. Specifically, naturally-occurring hollow particles may be used by purifying them as necessary. In addition, hollow particles synthesized by a known method such as a sol-gel method may also be used.

Organic hollow particles which may be used include, but are not limited to, hollow particles formed by an elastomer, a thermoplastic resin, a thermosetting resin and the like. Specific examples include polyethylene, polypropylene, polystyrene, polydivinylbenzene, polycycloolefin, polyphenylene oxide, polyphenylene sulfide, polysulfone, acrylic resin, silicone, polyamide, polyamide-imide, polyarylate, thermoplastic polyimide, polyetheretherketone, polyethernitrile, polyethylene oxide, polyethylene terephthalate, fluororesins such as Teflon®, epoxy resin, polyimide resin, aramid resin, triazine resin, phenolic resin, melamine resin, polybenzoxazole, polybenzimidazole, polybenzocyclobutene, polyepoxyacrylate and the like. Of these, substances having a crosslinked structure are preferred from the perspective of heat resistance.

The production method of these organic hollow particles is not especially limited. For example, the hollow particles may be produced by a known method such as emulsion polymerization, suspension polymerization and the like.

The hollow particles can be used either individually or in combination of two or more. Of these, inorganic hollow particles are preferred because the heat resistance can be increased and the linear expansion coefficient can be reduced. Among those, hollow particles containing Si are preferred because the dielectric constant can be reduced. More preferred are hollow particles having a main component of $SiO_2$, SiC, $Si_3N_4$, Shirasu, and glass, and especially preferred are hollow particles having a main component of $SiO_2$, Shirasu, and glass.

The hollow particles may be subjected to a surface treatment by a coupling agent, such as a silane coupling agent, an aluminate coupling agent, a titanate coupling agent, a silazane, an organosiloxane and the like, or by a resin and the like. Using hollow particles which have undergone such a surface treatment can control interfacial adhesion between the hollow particles and the resin obtained by polymerization of the cycloolefin monomer. As a result, improvements in the mechanical strength, solder dip resistance and the like can be expected.

As the coupling agent, a known coupling agent may be used. Specific examples thereof include allyltrimethoxysilane, 3-butenyltrimethoxysilane, styryltrimethoxysilane, styryltriethoxysilane, N-β-(N-(vinylbenzyl)aminoethyl)-γ-aminopropyltrimethoxysilane and salt thereof, allyltrichlorosilane, allylmethyldichlorosilane, styryltrichlorosilane, vinyltrimethoxysilane, vinyltriethoxysilane, vinyltriacetoxysilane, vinyltris(2-methoxyethoxy)silane, vinyltrichlorosilane, β-methacryloxyethyltrimethoxysilane, β-methacryloxyethyltriethoxysilane, γ-methacryloxypropyltrimethoxysilane, δ-methacryloxybutyltrimethoxysilane, γ-acryloxypropyltrimethoxysilane, γ-mercaptopropyltrimethoxysilane, γ-mercaptopropylmethyldimethoxysilane, γ-aminopropyltrimethoxysilane, N-phenyl-γ-aminopropyltrimethoxysilane, N-β-(aminoethyl)-γ-aminopropyltrimethoxysilane and the like.

Examples of the aluminate coupling agent include acetoalkoxyaluminum diisopropylate, aluminumdiisopropoxymonoethylacetoacetate, aluminumtrisethylacetoacetate, aluminumtrisacetylacetonate and the like.

Examples of the titanate coupling agent include triisostearoylisopropyltitanate, di(dioctylphosphate)diisopropyl titanate, didodecylbenzenesulfonyldiisopropyl titanate, diisostearyldiisopropyl titanate, isopropyltris(dioctylpyrophosphate)titanate, bis(dioctylpyrophosphate)oxyacetate titanate, bis(dioctylpyrophosphate)ethylene titanate, tetraisopropyl-bis(dioctylphosphite)titanate, tetraoctylbis(ditridecylphosphite)titanate and the like.

Examples of the silazane include hexamethyldisilazane, divinyltetramethyldisilazane, dibutyltetramethyldisilazane, diphenyltetramethyldisilazane and the like.

Of these, from the perspectives of dispersibility and adhesion, a silane coupling agent and a silazane are preferred, and a silane coupling agent is more preferred. Further, the silane coupling agent and silazane preferably have a hydrocarbon group. Examples of the hydrocarbon group include alkyl group, alkenyl group, cycloalkyl group, and aryl group. The cycloalkyl group and the aryl group may have alkyl group, alkenyl group, cycloalkyl group or aryl group as a substituent. Of these, the hydrocarbon group preferably is a group having a carbon-carbon double bond. Here a "group having a carbon-carbon double bond" is alkenyl group, or cycloalkyl group or aryl group having alkenyl group as a substituent. More preferably, the group containing an alkenyl group has a conjugation formed by a carbon-carbon double bond and another carbon-carbon double bond or aromatic ring. Most preferably, the group containing an alkenyl group has a conjugation formed by a carbon-carbon double bond and an aromatic ring because of the high radical reactivity.

Examples of preferred hydrocarbon groups include vinyl group, allyl group, butenyl group, styryl group, cyclohexenyl group, and norbornyl group.

Examples of most-preferred silane coupling agents include 3-butenyltrimethoxysilane, styryltrimethoxysilane, styryltriethoxysilane, allyltrichlorosilane, allylmethyldichlorosilane, styryltrichlorosilane, vinyltrimethoxysilane, vinyltriethoxysilane, vinyltriacetoxysilane, vinyltris(2-methoxyethoxy) silane, vinyltrichlorosilane and the like.

Using of these coupling agents can prevent the hollow particles from floating in the polymerizable composition, whereby uneven dispersion of the hollow particles in the obtained crosslinked body and the like can be suppressed. Further, heat resistance improves, such as an improvement in the solder dip resistance and a decrease in the linear expansion coefficient.

The surface treatment method with these coupling agents is not especially limited, as long as conditions in which the coupling agent can come into contact with the surface of the hollow particles are selected. Examples include a dry process in which the coupling agent is directly brought into contact with the surface of the hollow particles, and a wet process in which the hollow particles are added and mixed into a solution in which the coupling agent is dissolved in a solvent. However, a dry process is preferred, as the steps are simple and productivity is excellent. In a dry process, when the coupling agent and the hollow particles are brought into contact with each other, it is preferred to heat the mixture, as this allows for a shortening of the treatment time and uniform treatment.

The amount of the coupling agent with respect to the hollow particles is, based on 100 parts by weight of the hollow particles, usually 0.001 to 50 parts by weight, preferably 0.001 to 30 parts by weight, and more preferably 0.05 to 10 parts by weight.

For inorganic hollow particles, for example, the amount of the coupling agent used for the surface treatment can be determined as a weight ratio to the total amount of the hollow particles by measuring the carbon content with a carbon analyzer.

If the surface coating of the hollow particles are carried out with a resin, the coating method may be a known method. Specific examples include a method in which the hollow particles are charged into a resin solution, once the hollow particles have dispersed, and the solvent is removed, and a method in which the hollow particles are charged into a solution in which a monomer is present, the hollow particles are made to disperse, and polymerization is carried out in that state to form the resin to be used for coating in situ. Here, the solvent used in these methods is not especially limited.

The content of the hollow particles in the polymerizable composition of the present invention is usually 0.1 to 80% by volume, preferably 0.5 to 60% by volume, more preferably 1 to 50% by volume, and especially preferably 5 to 40% by volume. Further, this content is usually 0.01 to 95% by mass, preferably 0.1 to 75% by mass, more preferably 1 to 60% by mass, especially preferably 5 to 50% by mass, and most preferably 5 to 40% by mass.

In addition to the hollow particles, the polymerizable composition of the present invention may also comprise porous bodies. The porous bodies have many small pores, and some of these pores are open to the particle surface. Examples of the external shape of the porous bodies include, but are not especially limited to, spherical, plate-like, irregular, rod-like, fibrous and the like. Preferably, the porous bodies are a particle having a spherical or irregular shape. Using porous bodies can reduce dielectric constant unevenness depending on the location in the obtained crosslinked body and the like since the filling properties are excellent.

The porous bodies have a primary particle median size of usually 50 μm or less, preferably 0.01 to 50 μm, more preferably 0.05 to 25 μm, even more preferably 0.05 to 10 μm, and especially preferably 0.1 to 5 μm.

Further, the porous bodies have a void ratio of preferably 10% by volume or more, more preferably 30% by volume or more, more preferably 40 to 90% by volume, and especially preferably 50 to 80% by volume. If the void ratio is too small, the effects of reducing the relative permittivity tend to decrease. If the void ratio is too high, the strength of the porous bodies is insufficient, so that they tend to collapse.

Here, the void ratio is a value calculated by void ratio (%)= [pore volume (mL/g)/total particle volume (mL/g)]×100, from the total particle volume (mL/g) determined by an impact method and the pore volume (mL/g) determined by the BET method.

The average pore size of the porous bodies according to the Dollimore-Heal method (DH method) is preferably 0.1 to 100 nm, more preferably 0.1 to 50 nm, and even more preferably 1 to 10 nm. The DH method is an analysis method which determines a volume frequency distribution of the pore diameters from the relative pressure and the increase in adsorption amount of an adsorption gas, provided that the pores are cylindrical. If the average pore size is too small, the effects of reducing the linear expansion coefficient tend to decrease. On the other hand, if the average pore size is too large, the pores tend to be filled with the resin and the like, so that the effects of reducing the relative permittivity tend to decrease.

Further, the pore volume is preferably 0.1 to 5 mL/g, more preferably 0.3 to 3 mL/g, and especially preferably 0.5 to 2 mL/g.

If the pore volume is too small, the effects of reducing the relative permittivity tend to decrease. If the pore volume is too large, production of the porous bodies becomes difficult.

The BET specific surface area of the porous bodies is preferably 1 to 3,000 m$^2$/g, and more preferably 100 to 1,000 m$^2$/g.

(5) Crosslinking Agent

The polymerizable composition comprises a crosslinking agent in order to form a resin having crosslinking properties after the bulk polymerization.

Examples of the crosslinking agent include radical generation agents, epoxy compounds, compounds containing an isocyanate group, compounds containing a carboxyl group, compounds containing an acid anhydride group, compounds containing an amino group, Lewis acids and the like. These crosslinking agents can be used either individually or in combination of two or more. Among them, preferred are radical generation agents, epoxy compounds, compounds containing an isocyanate group, compounds containing a carboxyl group, and compounds containing an acid anhydride group. More preferred are radical generation agents, epoxy compounds, and compounds containing an isocyanate group. Especially preferred are radical generation agents.

Examples of the radical generation agent include organic peroxides, diazo compounds, and non-polar radical generation agents. Organic peroxides and nonpolar radical generation agents are preferred.

Examples of the organic peroxide include, but are not especially limited to, hydroperoxides such as t-butyl hydroperoxide, p-menthane hydroperoxide, and cumene hydroperoxide; dialkyl peroxides such as dicumyl peroxide, t-butyl cumyl peroxide, α,α'-bis(t-butylperoxy-m-isopropyl)benzene, di-t-butylperoxide, 2,5-dimethyl-2,5-di(t-butylperoxy)-3-hexine, and 2,5-dimethyl-2,5-di(t-butylperoxy)hexane; diacyl peroxides such as dipropionyl peroxide and benzoyl peroxide; peroxyketals such as 2,2-di(t-butylperoxy) butane, 1,1-di(t-hexylperoxy)cyclohexane, 1,1-di(t-butylperoxy)-2-methylcyclohexane, and 1,1-di(t-butylperoxy)cyclohexane; peroxy esters such as t-butylperoxy acetate and t-butylperoxy benzoate; peroxycarbonates such as t-butylperoxy isopropylcarbonate and di(isopropylperoxy)dicarbonate; alkylsilylperoxides such as t-butyltrimethylsilyl peroxide; peroxyketals; and the like. Of these, dialkyl peroxides and peroxyketals are preferable due to their small hindrance on the metathesis polymerization reaction.

Examples of the diazo compound include 4,4'-bisazidobenzal(4-methyl)cyclohexanone, 4,4'-diazidochalcone, 2,6-bis(4'-azidobenzal)cyclohexanone, 2,6-bis(4'-azidobenzal)-4-methylcyclohexanone, 4,4'-diazidodiphenylsulfone, 4,4'-diazidodiphenylmethane, 2,2'-diazidostilbene, and the like.

The non-polar radical generation agent used in the present invention is a compound having a dipole moment of usually 0.5 or less, preferably 0.3 or less, and more preferably 0.15 or less, which can generate a radical by heating, and which can initiate a crosslinking reaction. Examples of the non-polar radical generation agent include 2,3-dimethyl-2,3-diphenylbutane, 2,3-diphenylbutane, 1,4-diphenylbutane, 3,4-dimethyl-3,4-diphenylhexane, 1,1,2,2-tetraphenylethane, 2,2,3,3-tetraphenylbutane, 3,3,4,4-tetraphenylhexane, 1,1,2-triphenylpropane, 1,1,2-triphenylethane, triphenylmethane, 1,1,1-triphenylethane, 4,5-dimethyl-4,5-diphenyloctane, 1,1,1-triphenylpropane, 1,1,1-triphenylbutane, 1,1,1-triphenylpentane, 1,1,1-triphenyl-2-prop ene, 1,1,1-triphenyl-4-pentene, 1,1,1-triphenyl-2-phenylethane and the like.

These crosslinking agents may be used as a single or in combination of two or more. It is possible to arbitrarily control the glass transition temperature and molten state of the obtained crosslinkable resin by using two or more of these crosslinking agents and varying their blend proportions.

The radical generation agent preferably has a one minute half-life temperature of 150° C. to 350° C., and more preferably of 200° C. to 300° C. In the present invention, the "one minute half-life temperature" represents the temperature at which half of the radical generation agent decomposes in one minute.

The used amount of the crosslinking agent is usually 0.1 to 10 parts by mass, and preferably 0.5 to 5 parts by mass, based on 100 parts by mass of the cycloolefin monomer. If the amount of the crosslinking agent is too low, the crosslinking is insufficient, which can make it impossible to obtain a crosslinked resin with a high crosslinking density. If the amount of the crosslinking agent is too high, although the crosslinking effects become saturated, it can be impossible to obtain a thermoplastic resin and a crosslinked resin having the desired physical properties.

In the present invention, a crosslinking aid may be used to accelerate the crosslinking reaction. Examples of the crosslinking aid include dioxime compounds such as p-quinone dioxime; methacrylate compounds such as lauryl methacrylate and trimethylolpropane trimethacrylate; fumaric acid compounds such as a diallyl fumarate; phthalic acid compounds such as a diallyl phthalate; cyanuric acid compounds such as triallyl cyanurate and trimethallyl cyanurate; imide compounds such as maleimide and the like. Further, compounds having two or more isopropenyl groups, such as diisopropenylbenzene, triisopropenylbenzene, and trimethallyl isocyanurate, may also be preferably used. Although there are no specific limitations, the amount of the crosslinking aid used is usually 0 to 100 parts by mass, and preferably 0 to 50 parts by mass, based on 100 parts by mass of the cycloolefin monomer.

(6) Other Additives

Various additives, for example, a polymerization reaction retarder, a radical crosslinking retarder, a reinforcing material, a modifier, an antioxidant, a flame retardant, a coloring agent, and a light stabilizer can be added to the polymerizable composition. Further, a filler other than the above-described hollow particles and porous bodies may also be added. Examples of the shape of such fillers include, but are not especially limited to, spherical, irregular, rod-like, plate-like and the like. The material of the fillers is not especially limited, and the same material as the above-described hollow particles may be used. These additives may be dissolved or dispersed in a below-described monomer solution or catalyst solution beforehand.

Examples of the polymerization reaction retarder include phosphines such as triphenylphosphine, tributylphosphine, trimethylphosphine, triethylphosphine, dicyclohexylphosphine and vinyl diphenyphosphine; and Lewis bases such as aniline and pyridine. Of these, phosphines are preferred, as they can efficiently control the pot life of the polymerizable composition, and do not interfere much in the polymerization reaction.

Of the cycloolefin monomers which are capable of copolymerization with the norbornene monomer, cycloolefins having a 1,5-diene structure or a 1,3,5-triene structure in the molecule also function as a polymerization reaction retarder. Examples of such compounds include 1,5-cyclooctadiene and 5-vinyl-2-norbornene.

Examples of the radical crosslinking retarder include alkoxyphenols, catechols, and benzoquinones, and alkoxyphenols such as 3,5-di-t-butyl-4-hydroxyanisol are preferred.

Examples of the reinforcing material include short fibrous powders such as chopped strands, milled fibers and the like. Examples of the kinds of such fibers include glass fiber, paper base material, carbon fiber, metal fiber, aramid fiber and the like.

Examples of the modifier include elastomers such as natural rubber, polybutadiene, polyisoprene, styrene-butadiene copolymer (SBR), styrene-butadiene-styrene block copolymer (SBS), styrene-isoprene-styrene block copolymer (SIS), ethylene-propylene-diene terpolymer (EPDM), ethylene-vinyl acetate copolymer (EVA), and their hydrogenated products.

Examples of the antioxidant include various antioxidants for plastic or rubber such as a hindered phenol antioxidants, phosphorus antioxidants, amine antioxidants and the like. These antioxidants may be used individually, but preferably, they may be used in combination of two or more.

Examples of the flame retardant include a phosphorus-containing flame retardant, nitrogen-containing flame retardant, halogen-containing flame retardant, metal hydroxide flame retardant such as an aluminum hydroxide, an antimony compound such as antimony trioxide and the like. These flame retardants may be used individually, but preferably, they may be used in combination of two or more.

Examples of fillers other than the above-described hollow particles and porous bodies include glass powder, ceramic powder, silica and the like. These fillers may be used in combination of two or more. The filler may also be subjected to a surface treatment by a silane coupling agent and the like.

As the coloring agent, a dye or a pigment may be used. There are many kinds of dyes, and a known kind may be appropriately selected and used.

The method for preparing the polymerizable composition is not especially limited. For example, the polymerizable composition may be produced by preparing a dissolved or dispersed solution (hereinafter, sometimes referred to as "catalyst solution") in which the metathesis polymerization catalyst was dissolved or dispersed in an appropriate solvent, and preparing a separate solution (hereinafter, sometimes referred to as "monomer solution") in which the cycloolefin monomer is blended as necessary with additives such as hollow particles and a flame retardant, then adding the catalyst solution into the monomer solution and stirring the mixture. The mixing of the monomer solution and the catalyst solution is preferably carried out immediately before the below-described bulk polymerization. Further, the chain transfer agent, crosslinking agent, radical crosslinking retarder and the like may be added to the monomer solution and/or catalyst solution before mixing the monomer solution and the catalyst solution or after mixing the monomer solution and the catalyst solution.

When the hollow particles are used by dispersing them in the monomer solution, the hollow particles are preferably microparticles having a d90 particle size of 100 μm or less in the particle size distribution of the hollow particles in the monomer solution. Here, d90 is the particle size which includes 90% of the particles on a cumulative basis from the smaller direction based on number frequency particle size distributions. d50 is the median size.

A known dispersion apparatus may be used for dispersing the hollow particles in the monomer solution.

Examples include wheel type, ball type, blade type, and roll type devices, such as a mix muller, ball mill, kneader, Henschel mixer, roll mill, Banbury mixer, ribbon mixer, homogenizer, twin-screw extruder, and stone mill and the like.

[Crosslinkable Resin and Crosslinkable Resin Composite]

The crosslinkable resin of the present invention may be obtained by carrying out bulk polymerization of the above-described polymerizable composition.

Examples of the method for carrying out bulk polymerization of the polymerizable composition include (a) a method of pouring or coating the polymerizable composition onto a support medium and then carrying out bulk polymerization on the support medium; (b) a method of poring the polymerizable composition into a mold, and then carrying out bulk polymerization in the mold; and (c) a method of impregnating the polymerizable composition into a support medium, and then carrying out bulk polymerization among the support medium; and the like. If the polymerizable composition is subjected to bulk polymerization according to methods (a) or (c), a crosslinkable resin composite which includes the support medium and the crosslinkable resin is obtained.

A crosslinkable resin composite formed from the crosslinkable resin and the support medium can be obtained if method (a) is followed. Examples of the support medium used here include resins such as polyethylene terephthalate, polypropylene, polyethylene, polycarbonate, polyethylene naphthalate, polyarylate, and nylon; metal materials such as iron, stainless steel, copper, aluminum, nickel, chromium, gold, silver and the like. Although there are no specific limitations as to the shape of the support medium, a metal foil or a resin film is preferably used. For example, if a copper foil is used for the support medium, resin coated copper (RCC) foil can be obtained. The thickness of the metal foil or resin film is usually 1 to 150 μm, preferably 2 to 100 μm, and more preferably 3 to 75 μm from the standpoint of workability and the like. The surface of the support medium is preferably smooth. Further, the support medium surface has preferably been subjected to surface treatment such as an oxidation treatment by using plasma or the like; a chemical treatment such as a blackening treatment; a coupling agent treatment with silane coupling agent or the like.

There are no specific limitations on the method of coating the polymerizable composition onto the support medium. Examples thereof include known methods such as a spray coating method, a dip coating method, a roll coating method, a curtain coating method, a die coating method, a slit coating method and the like.

The bulk polymerization is started by heating the polymerizable composition to a temperature at which the metathesis polymerization catalyst works.

The method of heating the polymerizable composition to a prescribed temperature is not especially limited. Examples include a method of heating by placing the polymerizable composition on a heating plate, a method of heating (hot-pressing) the polymerizable composition while applying pressure using a press machine, a method of pressing the polymerizable composition using a heated roller, a method of using a furnace and the like.

The thickness of the crosslinkable resin film obtained in the above manner is usually 15 mm or less, preferably 10 mm or less, more preferably 5 mm or less, and especially preferably 1 mm or less.

A crosslinkable resin molded body in an arbitrary shape can be obtained if method (b) is followed. Examples of the shape of the molded body include a sheet, film, column, cylinder, and polygonal column.

As the mold used here, a commonly known mold, for example, a split mold having a core die and a cavity die can be used. Bulk polymerization of the polymerizable composition is carried out after the polymerizable composition is injected into the cavity. The core and cavity dies are fabricated so that a vacant space may be provided conforming to the shape of a desired molded product. There are no specific limitations on the shape, material, or size of the mold. A molded body of the crosslinkable resin in the form of a sheet or a film can also be obtained by providing plate molds composed of a glass plate, a metal plate or the like, and a spacer with a prescribed thickness, and injecting the polymerizable composition into the space formed by putting the spacer between the two sheets of plate molds.

The filling pressure (injection pressure) for filling the polymerizable composition into the cavity of the mold is usually 0.01 to 10 MPa, and preferably 0.02 to 5 MPa. If the filling pressure is too low, there is a tendency where the transfer surface formed in the inner surface of the cavity is not transferred in a proper manner. Too high a filling pressure requires a highly rigid mold and is, therefore, uneconomical. The mold clamping pressure is usually within the range of 0.01 to 10 MPa.

The support medium which is used in the method (c) is a textile material.

According to this method, a prepreg, which is a crosslinkable resin composite, in which the crosslinkable resin is impregnated in the textile material can be obtained. The textile material used here is made of an organic and/or inorganic fiber. Examples thereof include known fibers such as glass fiber, carbon fiber, aramid fiber, polyethylene terephthalate fiber, vinylon fiber, polyester fiber, amide fiber, metal fiber, and ceramic fiber, polyarylate fiber, a fluororesin fiber and the like. These fibers can be used either individually or in combination of two or more Examples of the form of the textile material include a mat, cloth, nonwoven fabric and the like. Further, the surface of the textile material has preferably been subjected to surface treatment such as an oxidation treatment by using plasma or the like; a chemical treatment such as a blackening treatment; and a coupling agent treatment with a silane coupling agent or the like.

The impregnation of the polymerizable composition into the textile material may be carried out by a method of coating a prescribed amount of the polymerizable composition onto the textile material by a known method such as spray coating, dip coating, roll coating, curtain coating, die coating, or slit coating, layering a protective film over the coated polymerizable composition, as required, and pressing the resulting material from above using a roller or the like. The impregnation may also be carried out by employing a metal foil or resin film together with a textile material as the support medium, arranging the textile material on the metal foil or resin film, and then impregnating the polymerizable composition into the textile material in the same manner. After the textile material has been impregnated with the polymerizable composition, the resulting impregnated product is heated to a prescribed temperature to carry out bulk polymerization of the polymerizable composition, whereby a crosslinkable resin-impregnated prepreg can be obtained.

There are no specific limitations on the method of heating the impregnated product. For example, the above-mentioned method (a) can be employed, in which case the impregnated product may be further placed on another support medium and heated. Alternatively, the polymerizable composition may be injected into a mold in which the textile material has been set to impregnate the polymerizable composition into the textile material, and then the bulk polymerization may be carried out therein by following the method (b).

Since the polymerizable composition has a lower viscosity than conventional resin varnishes, and has excellent impregnation properties with respect to the textile material, the crosslinkable resin can be uniformly impregnated into the textile material.

Since the polymerizable composition contains only a small amount of the solvent and the like which does not participate in the reaction, a step of removing the solvent after impregnation of the polymerizable composition into the textile material is not required. Therefore, productivity is good and problems such as odor, blister and the like do not occur. Furthermore, since the crosslinkable resin of the present invention has excellent storage stability, the resulting prepreg also has excellent storage stability.

In any of the above methods (a), (b), and (c), the heating temperature for polymerizing the polymerizable composition is usually 50 to 250° C., and preferably 100 to 200° C. The polymerization period may be appropriately selected, and is usually 10 seconds to 20 minutes, and preferably within 5 minutes.

The polymerization reaction starts when the polymerizable composition is heated to a predetermined temperature. This polymerization reaction is an exothermic reaction. Thus, once the bulk polymerization starts, the temperature of the reaction solution will rapidly increase and reach a peak temperature in a short time (e.g., about 10 seconds to 5 minutes). If the maximum temperature during the polymerization reaction is too high, the crosslinking reaction may also proceed, whereby a crosslinked body is obtained. This can make it difficult to obtain the crosslinkable resin. Therefore, to ensure that only the polymerization reaction completely proceeds and to inhibit the crosslinking reaction, it is preferred to control the peak temperature during the bulk polymerization reaction to usually not more than the one minute half-life temperature of the radical generation agent, preferably to 230° C. or less, and more preferably to less than 200° C.

The crosslinkable resin of the present invention is crosslinkable. The term "crosslinkable" herein refers to the ability for the resin to become a crosslinked body when heated due to a crosslinking reaction proceeding.

Further, the crosslinkable resin composite of the present invention is a composite material in which the above-described crosslinkable resin and the above-described support medium are integrally formed.

Since the bulk polymerization of the polymerizable composition almost completely proceeds, the crosslinkable resin of the present invention contains only a small amount of residual monomers. Thus, the work environment does not deteriorate due to an odor or the like originating from monomers. Further, if a crosslinking agent having a high decomposition temperature is used, the crosslinkable resin suitably flows during the crosslinking, which results in improved adhesion with the support medium, such as a metal foil, and improved embedding properties into a printed circuit board. In addition, the crosslinked body obtained using the above-described crosslinking agent has a remarkably reduced dielectric loss (tan δ), so that the electric properties are excellent.

The crosslinkable resin of the present invention preferably is soluble in a solvent such as aromatic hydrocarbons such as benzene and toluene, ethers such as diethyl ether and tetrahydrofuran, and halogenated hydrocarbons such as dichloromethane and chloroform. Further, since the crosslinkable resin of the present invention exhibits thermoplastic properties, the crosslinkable resin can be formed into various shapes by melt molding at a temperature where the crosslinking reaction does not occur.

The molded body of the crosslinkable resin of the present invention may be a partially crosslinked body. For example, when the polymerizable composition is subjected to bulk polymerization in the mold, it is difficult for the heat generated by the polymerization reaction to radiate from the center of the mold. As a result, the temperature on part of the mold can become too high. The crosslinking reaction proceeds at the high-temperature portions, thereby producing a partially crosslinked body. However, if the surface portions which tend to radiate heat are formed with a crosslinkable resin, the effects as a molded body of the crosslinkable resin of the present invention can be sufficiently enjoyed. Even for the composite of the crosslinkable resin, the crosslinkable resin may similarly be a partially crosslinked body.

Since the crosslinkable resin of the present invention is obtained as a result of the bulk polymerization almost completely proceeding, there is no risk of the polymerization reaction proceeding even further during storage. Although the crosslinkable resin of the present invention contains a crosslinking agent such as a peroxide, unless the resin is heated to at least a temperature which would cause the crosslinking reaction to proceed, problems such as changes in the surface hardness do not arise. The present crosslinkable resin thus has excellent storage stability.

[Crosslinked Body]

The crosslinked body of the present invention is formed by crosslinking the above-described crosslinkable resin.

The crosslinking of the crosslinkable resin can be carried out by heating and melting the crosslinkable resin of the present invention and then maintaining the temperature not less than a temperature which causes the crosslinkable resin to undergo the crosslinking reaction. The temperature for crosslinking the crosslinkable resin is preferably higher than the peak temperature during the bulk polymerization by 20° C. or more. Usually, this temperature is 170 to 250° C., and more preferably 180 to 220° C. Although there are no specific limitations, the crosslinking period is usually from several minutes to several hours.

When the crosslinkable resin is a molded body in the form of a sheet or a film, the molded body is preferably laminated and heat-pressed as necessary on a substrate. The pressure applied for press-heating is usually 0.5 to 20 MPa, and preferably 3 to 10 MPa. The heat-pressing may be carried out in a vacuum or under a reduced pressure atmosphere. The heat-pressing may be carried out using a known pressing machine having a press frame mold for forming plates, a press-forming machine such as an SMC (sheet mold compound) or a BMC (bulk mold compound) and the like.

[Crosslinked Resin Composite]

The crosslinked resin composite of the present invention comprises the above-described crosslinked body and a support medium.

The crosslinked resin composite of the present invention is obtained by crosslinking the above-described crosslinkable resin composite. The crosslinked resin composite may also be obtained by heating and crosslinking a crosslinkable resin molded body on a support medium.

Further, the crosslinked resin composite may also be obtained by heating and crosslinking the crosslinkable resin composite on a separate support medium. Specific examples thereof include a method in which the crosslinkable resin composite which is obtained by method (a) and is formed from a crosslinkable resin and a support medium, and a separate support medium are laminated so that the crosslinkable resin and the separate support medium contact, and then heating and crosslinking the resulting laminate; and a method in which a prepreg obtained by method (c) is laminated on a separate support medium so as to be in contact therewith, and then heating and crosslinking the resulting laminate.

The method of heating and crosslinking the crosslinkable resin molded body or crosslinkable resin composite on a support medium includes hot-pressing method. For example, a crosslinkable resin in the form of a sheet or a film may be laminated on a support medium by heat-pressing, and then further heated to crosslink the crosslinkable resin. The heat-press conditions may be the same as those for the crosslinking of the above crosslinkable resin.

Examples of the separate support mediums which may be used here include metal foils such as copper foil, aluminum foil, nickel foil, chromium foil, gold foil, and silver foil; a printed circuit board; films such as a conductive polymer film and other resin films and the like. If a printed circuit board is used as the support medium, a multilayer printed circuit board can be produced.

It is preferred to treat the surface of the metal foil such as copper foil or the conductive layer on the printed circuit board with a silane coupling agent, a thiol coupling agent, a titanate coupling agent, or various types of adhesive. Of these, it is especially preferred to treat with a silane coupling agent. Further, it is also preferred to carry out a chemical treatment such as a blackening treatment.

Since the crosslinkable resin of the present invention is excellent in fluidity and adhesion, a composite being excellent in smoothness and adhesion with the support medium can be obtained. For example, when using a very flat (SLP) copper foil is used as the support medium, the composite of the present invention preferably is 0.4 kN/m or more, and more preferably 0.6 kN/m or more in a peel strength as measured based on JIS C 6481.

The crosslinked body and composite of the present invention are excellent in electric insulation, mechanical strength, heat resistance, dielectric properties and the like. Further, the composite has excellent adhesion with the support medium, and is suitable as an electric material.

EXAMPLES

The present invention will now be described in detail by way of examples and comparative examples, which should not be construed as limiting the present invention. In the examples and comparative examples below "parts" and "%" are indicated on a mass basis, unless otherwise specified.

The respective characteristics in the examples and comparative examples were measured and evaluated according to the following methods.

(1) Mixing Properties

The polymerizable composition was impregnated in a glass cloth. After 30 seconds had elapsed, whether the filler (hollow particles) in the polymerizable composition had floated out and separated on the surface of the polymerizable composition was visually observed.

No separation: "O"
Separation: "X"

(2) Relative Permittivity

The relative permittivity ($\epsilon$) at a 1 GHz frequency was measured by a capacitance method using an impedance analyzer (manufactured by Agilent Technologies, Model No. E4991A).

An $\epsilon$ of less than 3.5 was evaluated with an "A",
of 3.5 or more to less than 3.6 with a "B", and
of 3.6 or more with a "C".

A smaller $\epsilon$ represents better electric characteristics.

(3) Solder Dip Resistance (Floating)

A laminated sheet was floated in a 260° C. solder bath for 20 seconds, and then the laminated sheet was observed for any swelling or warping.

0 or 1 of swelling or warping: "A"
2 or 3 of swelling or warping: "B"
4 or more of swelling or warping: "C"

(4) Solder Dip Resistance (Dipping)

A laminated sheet was dipped in a 260° C. solder bath for 60 seconds, and then the laminated sheet was observed for any swelling or warping.

0 or 1 of swelling or warping: "A"
2 or 3 of swelling or warping: "B"
4 or more of swelling or warping: "C"

(5) Fluidity

A laminated sheet was etched, and then the number of visually observed whitened portions (thinning due to poor fluidity) was counted.

"A": Zero of whitened portion;
"B" 1 to 3 of whitened portions;
"C": 4 or more of whitened portions (6) Linear Expansion Coefficient The linear expansion coefficient was measured using the thermal analysis apparatus TMASS 6100 manufactured by Seiko Instruments Inc. The linear expansion coefficient was measured from 50° C. to 100° C. using a laminated sheet (1 mm thick) from which the copper foil had been removed by etching.

A linear expansion coefficient of less than 60 ppm was evaluated with an "A",
of 60 ppm or more to less than 70 ppm with a "B",
of 70 ppm or more to less than 80 ppm with a "C", and
of 80 ppm or more with a "D".

Example 1

In a flask made of glass, 51 parts of benzylidene (1,3-dimethyl-4-imidazolidin-2-ylidene)(tricyclohexylphosphine)ruthenium dichloride and 79 parts of triphenylphosphine were dissolved in 952 parts of toluene to prepare a catalyst solution.

In a polyethylene bottle, 40 parts of 2-norbornene (NB) and 60 parts of tetracyclo[$6.2.1.1^{3,6}.0^{2,7}$]dodec-4-ene (TCD) as cycloolefin monomers were fed, and 0.74 part of allyl methacrylate as a chain transfer agent, 1.2 parts of di-t-butylperoxide (one minute half-life temperature of 186° C.) as a crosslinking agent, 1 part of tristearylisopropoxy titanate (Plenact TTS, Ajinomoto Fine-Techno Co., Inc.) as a dispersant, and 29.5 parts of Shirasu balloons (SFB 101, manufactured by Silax Co., Ltd., particle size of 10 µm, void ratio of 60% by volume) as hollow particles were added. The resultant mixture was mixed to prepare a monomer solution. The above-described catalyst solution was charged into the monomer solution in a proportion of 0.12 ml per 100 g of the cycloolefin monomers, and the resultant mixture was stirred to prepare a polymerizable composition.

Next, 100 parts of this polymerizable composition was cast on a polyethylene naphthalate film (Type Q51, thickness of 75 µm, manufactured by DuPont Teijin Films Japan Limited). Then, a glass cloth (Product Number 2112, thickness of 69 µm) was laid over this, and 80 parts of the above polymerizable composition was further cast over the glass cloth. A polyethylene naphthalate film was then covered over the top of this, and the polymerizable composition was impregnated through the whole of the glass cloth using a roller. Then, the resultant product was left for 1 minute in a heating furnace heated to 150° C. to carry out bulk-polymerization of the polymerizable composition, whereby a 0.13 mm thick prepreg was obtained.

This prepreg was cut into a size having 100-mm-square, and the polyethylene naphthalate film was peeled off. Six of such pieces were stacked upon each other, and the resultant product was heat-pressed for 15 minutes at 200° C. and 3 MPa by a hot press to produce a laminated sheet. The results of evaluation of the laminated sheet are shown in Table 1.

TABLE 1

|  | Ex. 1 | Ex. 2 | Ex. 3 | Ex. 4 | Ex. 5 |
|---|---|---|---|---|---|
| Cycloolefin Monomer | NB/TCD | NB/TCD | DCP | NB/TCD | NB/TCD |
| (parts) | 40/60 | 40/60 | 100 | 40/60 | 40/60 |
| Chain Transfer Agent | Allyl Methacrylate | Allyl Methacrylate | Allyl Methacrylate | Allyl Methacrylate | Allyl Methacrylate |
| Crosslinking Agent | Di-t-butyl peroxide | Di-t-butyl peroxide | Di-t-butyl peroxide | Di-t-butyl peroxide | Di-t-butyl peroxide |
| Filler | Shirasu Balloons SFB 101 | Hollow Silica DBS-0350 | Hollow Silica DBS-0350 | Hollow Silica DBS-0350 | Hollow Silica DBS-0350 |
| Kind of Surface Treating Agent | — | — | — | HMDS | Styryl trimethoxy silane |
| Amount (parts) of Surface Treating Agent | — | — | — | 1 | 1 |
| Median Size (µm) | 10 | 3 | 3 | 3 | 3 |
| Void Ratio (% by volume) | 60 | 52 | 52 | 52 | 52 |
| Used Amount (parts) | 29.5 | 47 | 47 | 47 | 47 |
| Content (% by volume) | 31 | 31 | 31 | 31 | 31 |

TABLE 1-continued

|  | Ex. 1 | Ex. 2 | Ex. 3 | Ex. 4 | Ex. 5 |
|---|---|---|---|---|---|
| Polymerizable Composition Characteristics |  |  |  |  |  |
| Mixing Properties | ○ | ○ | ○ | ○ | ○ |
| Relative Permittivity | B | A | A | A | A |
| Solder dip resistance (floating for 20 sec.) | A | A | A | A | A |
| Solder dip resistance (Dipping for 60 sec.) | B | B | B | A | A |
| Fluidity | A | A | B | A | A |
| Linear Expansion Coefficient | B | B | B | A | A |

Example 2

A polymerizable composition, a prepreg, and a laminated sheet were obtained in the same manner as in Example 1, except that 47 parts of hollow silica (DBS-0350, manufactured by Denki Kagaku Kogyo Kabushiki Kaisha, particle size of 3 μm, void ratio of 52% by volume) was used instead of the Shirasu balloons. The evaluated results of the respective characteristics are shown in Table 1.

Example 3

A polymerizable composition, a prepreg, and a laminated sheet were obtained in the same manner as in Example 2, except that 100 parts of dicyclopentadiene (DCP) was used instead of the 40 parts of NB and the 60 parts of TCD. The evaluated results of the respective characteristics are shown in Table 1.

Example 4

In a glass container, 100 parts of hollow silica (DBS-0350, manufactured by Denki Kagaku Kogyo Kabushiki Kaisha, particle size of 3 μm, void ratio of 52% by volume) was fed. Then, 1 part of hexamethyldisilazane (HMDS) was added, and the resultant mixture was stirred for 15 minutes with a stirrer (Excel Auto Homogenizer, manufactured by NISSEI Corporation) under a nitrogen gas flow to perform surface treatment. The resultant surface-treated hollow silica was placed in an inert oven, and dried for 1 hour at 100° C. under a nitrogen gas flow. A polymerizable composition, a prepreg, and a laminated sheet were obtained in the same manner as in Example 1, except that 47 parts of this surface-treated hollow silica was used instead of the Shirasu balloons. The evaluated results of the respective characteristics are shown in Table 1.

Example 5

Surface-treated hollow silica was obtained in the same manner as in Example 4, except that 1 part of p-styryltrimethoxysilane (Product Name KBM-1403, manufactured by Shin-Etsu Chemical Co. Ltd.) was used instead of the 1 part of hexamethyldisilazane. A polymerizable composition, a prepreg, and a laminated sheet were obtained in the same manner as in Example 1, except that 47 parts of this surface-treated hollow silica was used instead of the Shirasu balloons. The evaluated results of the respective characteristics are shown in Table 1.

Comparative Example 1

A polymerizable composition, a prepreg, and a laminated sheet were obtained in the same manner as in Example 1, except that 100 parts of spherical silica (FB-105, manufactured by Denki Kagaku Kogyo Kabushiki Kaisha, particle size of 12 μm, void ratio of 0% by volume) was used instead of the Shirasu balloons. The evaluated results of the respective characteristics are shown in Table 2.

Comparative Example 2

A polymerizable composition, a prepreg, and a laminated sheet were obtained in the same manner as in Comparative Example 1, except that the used amount of the spherical silica FB-105 was changed to 50 parts. The evaluated results of the respective characteristics are shown in Table 2.

Comparative Example 3

A polymerizable composition, a prepreg, and a laminated sheet were obtained in the same manner as in Example 1, except that 100 parts of dicyclopentadiene (DCP) was used instead of the 40 parts of NB and the 60 parts of TCD, and that a chain transfer agent and crosslinking agent were not used. The evaluated results of the respective characteristics are shown in Table 2.

Comparative Example 4

A polymerizable composition was prepared in the same manner as in Comparative Example 3, except that 47 parts of a foam stabilizer (X-20-1612, manufactured by Shin-Etsu Chemical Co. Ltd.) was used instead of the Shirasu balloons. Next, a prepreg and a laminated sheet were obtained in the same manner as in Comparative Example 3, except that the polymerizable composition was impregnated without using a roller. The evaluated results of the respective characteristics are shown in Table 2.

The air bubble volume percentage in the resin contained in the prepreg (namely, the volume percentage of air bubbles in the residue obtained by subtracting the volume of the glass cloth from the volume of the prepreg) was 30% by volume. The air bubble volume percentage was determined by preparing a polymerizable composition in the same manner as in Comparative Example 4 except for not using the foam stabilizer, determining the specific gravity of a prepreg obtained using this polymerizable composition (namely, the specific gravity of only the resin and the glass cloth), determining the specific gravity of the prepreg obtained in Comparative Example 4, and performing a calculation based on these two specific gravities. The mixing properties of the polymerizable composition obtained in Comparative Example 4 were evaluated with an "X", since the air bubbles had risen out.

TABLE 2

|  | Comp. Ex. 1 | Comp. Ex. 2 | Comp. Ex. 3 | Comp. Ex. 4 |
|---|---|---|---|---|
| Cycloolefin Monomer (parts) | NB/TCD 40/60 | NB/TCD 40/60 | DCP 100 | DCP 100 |
| Chain Transfer Agent | Allyl Methacrylate | Allyl Methacrylate | None | None |
| Crosslinking Agent | Di-t-butyl peroxide | Di-t-butyl peroxide | None | None |
| Filler | Spherical Silica FB-105 | Spherical Silica FB-105 | Shirasu Balloons SFB 101 | Foam Stabilizer, Air Bubbles |
| Kind of Surface Treating Agent | — | — | — | — |
| Amount (parts) of Surface Treating Agent | — | — | — | — |
| Median Size (μm) | 12 | 12 | 10 | — |
| Void Ratio (% by volume) | 0 | 0 | 60 | — |
| Used Amount (parts) | 100 | 50 | 29.5 | — |
| Content (% by volume) | 31 | 19 | 31 | 30 |
| Polymerizable Composition Characteristics |  |  |  |  |
| Mixing Properties | ○ | ○ | ○ | X |
| Relative Permittivity | C | A | A | A |
| Solder dip resistance (floating for 20 sec.) | A | B | A | C |
| Solder dip resistance (Dipping for 60 sec.) | A | C | D | D |
| Fluidity | A | A | C | C |
| Linear Expansion Coefficient | B | D | B | D |

*The content in Comparative Example 4 is a volume percentage of air bubbles in the prepreg.

As shown in Table 1, in the examples of the present invention, there is no floating out of the filler from inside the polymerizable composition, the solder dip resistance is rich, the linear expansion coefficient is low, fluidity is excellent, and the balance among the respective characteristics is good.

In contrast, as shown in Table 2, in Comparative Examples 1 and 2, which used non-hollow particles, it was difficult to obtain a balance among the characteristics such as the relative permittivity and the linear expansion coefficient. When the relative permittivity is set to be low, the linear expansion coefficient increases, while if the linear expansion coefficient is set to be low, the relative permittivity increases.

The invention claimed is:

1. A polymerizable composition comprising a cycloolefin monomer, a metathesis polymerization catalyst, a chain transfer agent, a crosslinking agent, and hollow particles.

2. The polymerizable composition according to the claim 1, wherein primary particles of the hollow particles have a median size of 50 μm or less.

3. The polymerizable composition according to the claim 1, wherein the hollow particles have a void ratio of 10% by volume or more.

4. The polymerizable composition according to claim 1, wherein content of the hollow particles is 0.1 to 80% by volume.

5. The polymerizable composition according to claim 1, wherein the hollow particles are inorganic hollow particles.

6. The polymerizable composition according to claim 1, wherein the hollow particles are surface treated by a coupling agent.

7. The polymerizable composition according to claim 1, wherein the metathesis polymerization catalyst is a ruthenium-carbene complex.

8. A crosslinkable resin obtained by bulk polymerization of the polymerizable composition according claim 1.

9. A method of producing a crosslinkable resin, comprising steps of:
preparing a polymerizable composition comprising a cycloolefin monomer, a metathesis polymerization catalyst, a chain transfer agent, a crosslinking agent, and hollow particles; and
carrying out bulk polymerization of the polymerizable composition.

10. A method of producing a crosslinkable resin composite, comprising steps of:
preparing a polymerizable composition comprising a cycloolefin monomer, a metathesis polymerization catalyst, a chain transfer agent, a crosslinking agent, and hollow particles;
coating or impregnating the polymerizable composition onto or into a support medium; and then
carrying out bulk polymerization of the polymerizable composition.

11. A method of producing a crosslinked body, comprising steps of:
preparing a polvmerizable composition comprising a cycloolefin monomer, a metathesis polymerization catalyst, a chain transfer agent, a crosslinking agent, and hollow particles;
carrying out bulk polymerization of the polymerizable composition to obtain a crosslinkable resin; and
crosslinking the crosslinkable resin.

12. A method of producing a crosslinked resin composite, comprising steps of:
preparing a polymerizable composition comprising a cycloolefin monomer, a metathesis polymerization catalyst, a chain transfer agent, a crosslinking agent, and hollow particles;
carrying out bulk polymerization of the polymerizable composition to obtain a crosslinkable resin;
molding the crosslinkable resin to obtain a molded body; and
crosslinking the molded body on a support medium.

13. A method of producing a crosslinked resin composite, comprising steps of:
preparing a polymerizable composition comprising a cycloolefin monomer, a metathesis polymerization catalyst, a chain tratransfer agent, a crosslinking agent, and hollow particles;
coating or impregnating the polymerizable composition onto or into a support medium; and then
carrying out bulk polymerization of the polymerizable composition to obtain a crosslinkable resin composite; and
crosslinking the crosslinkable resin composite.

14. The method of producing a crosslinked resin composite according to the claim 13, wherein the step of crosslinking is carried out on a separate support medium.

* * * * *